United States Patent
Liu et al.

(10) Patent No.: US 11,792,550 B2
(45) Date of Patent: *Oct. 17, 2023

(54) PIXEL CIRCUIT OUTPUTTING PULSE WIDTH SIGNAL AND OPTICAL SENSOR USING THE SAME

(71) Applicant: PixArt Imaging Inc., Hsin-Chu County (TW)

(72) Inventors: Ren-Chieh Liu, Hsin-Chu County (TW); Chih-Huan Wu, Hsin-Chu County (TW); Yi-Hsien Ko, Hsin-Chu County (TW); Han-Chi Liu, Hsin-Chu County (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/071,477

(22) Filed: Nov. 29, 2022

(65) Prior Publication Data

US 2023/0106895 A1 Apr. 6, 2023

Related U.S. Application Data

(63) Continuation of application No. 17/672,028, filed on Feb. 15, 2022, now Pat. No. 11,546,540, which is a continuation of application No. 17/009,417, filed on Sep. 1, 2020, now Pat. No. 11,290,671.

(51) Int. Cl.
*H04N 25/772* (2023.01)
*H01L 27/146* (2006.01)

(52) U.S. Cl.
CPC ..... *H04N 25/772* (2023.01); *H01L 27/14643* (2013.01)

(58) Field of Classification Search
CPC ...... H04N 25/772; H04N 25/76; H04N 25/77; H04N 25/771; H01L 27/14643
See application file for complete search history.

(56) References Cited

U.S. PATENT DOCUMENTS

| | | | |
|---|---|---|---|
| 9,936,153 B1 | 4/2018 | Mao et al. | |
| 11,290,671 B2 * | 3/2022 | Liu | H04N 25/772 |
| 2010/0259660 A1 | 10/2010 | Kukita | |
| 2011/0025898 A1 * | 2/2011 | Ni | H04N 25/77 348/308 |
| 2015/0332568 A1 * | 11/2015 | Kurokawa | H04N 25/771 348/152 |
| 2016/0344969 A1 | 11/2016 | Furukawa et al. | |
| 2017/0163913 A1 | 6/2017 | Shigeta et al. | |
| 2017/0318248 A1 | 11/2017 | Maehashi | |

(Continued)

*Primary Examiner* — Albert H Cutler
(74) *Attorney, Agent, or Firm* — BRUCE STONE LLP; Joseph A. Bruce (57) ABSTRACT

There is provided a pixel circuit for performing analog operation including a photodiode, a first temporal circuit, a second temporal circuit and an operation circuit. Within a first interval, the photodiode detects first light energy to be stored in the first temporal circuit. Within a second interval, the photodiode detects second light energy to be stored in the second temporal circuit. Within an operation interval, the first temporal circuit outputs a first detection signal having a first pulse width according to the first light energy and outputs a second detection signal having a second pulse width according to the second light energy for being calculated by the operation circuit.

16 Claims, 9 Drawing Sheets

(56) References Cited

U.S. PATENT DOCUMENTS

2017/0353675 A1* 12/2017 Onuki ................. H04N 25/745
2018/0063459 A1    3/2018 Stark
2018/0227516 A1    8/2018 Mo et al.
2022/0159201 A1    5/2022 Kitano

* cited by examiner

FIG. 10

PIXEL CIRCUIT OUTPUTTING PULSE WIDTH SIGNAL AND OPTICAL SENSOR USING THE SAME

CROSS REFERENCE TO RELATED APPLICATION

This application is a continuation application of U.S. patent application Ser. No. 17/672,028 filed on Feb. 15, 2022, which is a continuation application of U.S. patent application Ser. No. 17/009,417 filed on Sep. 1, 2020, the full disclosures of which are incorporated herein by reference.

To the extent any amendments, characterizations, or other assertions previously made (in this or in any related patent applications or patents, including any parent, sibling, or child) with respect to any art, prior or otherwise, could be construed as a disclaimer of any subject matter supported by the present disclosure of this application, Applicant hereby rescinds and retracts such disclaimer. Applicant also respectfully submits that any prior art previously considered in any related patent applications or patents, including any parent, sibling, or child, may need to be re-visited.

BACKGROUND

1. Field of the Disclosure

This disclosure generally relates to a pixel structure and, more particularly, to a pixel circuit capable of outputting pulse width signals corresponding to detected light energy and performing analog operation.

2. Description of the Related Art

Nowadays, the optical sensor outputs voltage values to be converted to a digital image frame by an analog-to-digital converter, and then a processor of the optical sensor performs the following operation using the digital image frame, e.g., calculating displacement or performing motion detection.

However, in an optical sensor performing the operation in a digital backend thereof, the digital backend generally needs frame buffers to store the whole digital image frame. Generally, the optical sensor needs two frame buffers to store pixel data.

Accordingly, it is necessary to provide a pixel structure that performs various operations on pixel data at analog phase.

SUMMARY

The present disclosure provides a pixel circuit that represents detected light intensity using a pulse width, and performs the pixel-wise operation, including intra-pixel and inter-pixel operations, using pulse width signals.

The present disclosure provides a pixel circuit including a photodiode and a temporal circuit. The photodiode is configured to generate light energy. The temporal circuit is configured to convert the light energy generated by the photodiode to a detection signal having a pulse width corresponding to the light energy. The temporal circuit includes a storage capacitor, a first transistor, a second transistor and a third transistor. The storage capacitor has a first end coupled to the photodiode, and configured to store the light energy. The first transistor is configured to be controlled by a control signal to convert the light energy to the detection signal. The second transistor is coupled between a second end of the storage capacitor and the first transistor. The third transistor is coupled between the second end of the storage capacitor and a ground voltage.

The present disclosure further provides a pixel circuit including a photodiode and temporal circuit. The temporal circuit is coupled to the photodiode and includes a capacitor, a first transistor, a second transistor and a third transistor. The capacitor has a first end coupled to the photodiode. The first transistor is coupled between a voltage source and a node. The second transistor is coupled between a second end of the capacitor and the node. The third transistor is coupled between the node and a ground voltage, and a controlled terminal thereof is coupled to the second end of the capacitor.

The present disclosure further provides an optical sensor including a photodiode, a first temporal circuit and a second temporal circuit. The photodiode is configured to generate light energy. The first temporal circuit and the second temporal circuit are both coupled to the photodiode and respectively configured to store the light energy within different time intervals. Each of the first temporal circuit and the second temporal circuit includes a capacitor, a first transistor, a second transistor and a third transistor. The capacitor has a first end coupled to the photodiode. The first transistor is coupled between a voltage source and a node. The second transistor is coupled between the node and a second end of the capacitor. The third transistor is coupled between the node and a ground voltage, and a controlled terminal thereof is connected to the second end of the capacitor.

The temporal circuit of the present disclosure is used to store detected light energy of different time intervals and to output detection signals of different pulse widths, wherein the pulse width is positively related to the detected light energy.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The present disclosure is related to a pixel circuit that performs pixel-wise analog operation. Every pixel outputs a detection signal having a pulse width corresponding to detected light energy. An operation circuit is used to perform the analog operation on the pulse width (PW) signals. The voltage value after the analog operation is further converted to a PW signal using a voltage-temporal conversion circuit at first and then a next analog operation is performed by the same or by another operation circuit. In this way, all data operation is accomplished in the analog phase without being converted to digital data at first.

Figure 1:
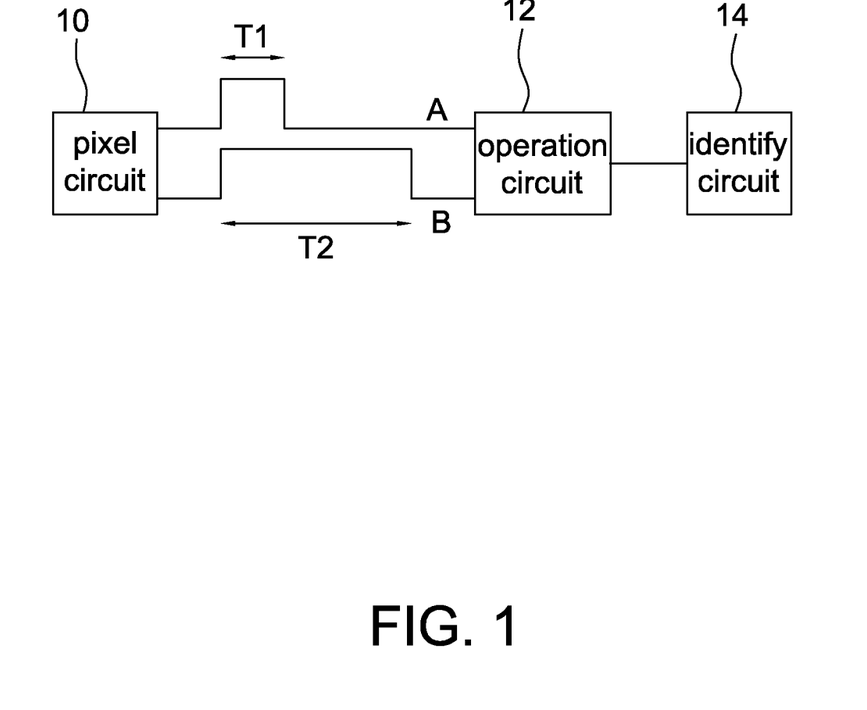
FIG. 1 is a schematic block diagram of a pixel structure of an optical sensor according to one embodiment of the present disclosure.

Referring to FIG. 1, it is a schematic block diagram of a pixel structure of an optical sensor (e.g., CMOS image sensor) according to one embodiment of the present disclosure. The pixel structure includes a pixel circuit 10 and an operation circuit 12. The pixel circuit 10 is used to output detection signals of different time intervals, e.g., signals A and B in FIG. 1 indicating different detection signals detected within different time intervals. In the present disclosure, the detection signals A and B respectively indicate magnitude of light energy detected by the pixel circuit 10 using pulse widths T1 and T2, wherein when the detected light energy is larger, the pulse width of the corresponding detection signals A or B is longer.

Figure 5:
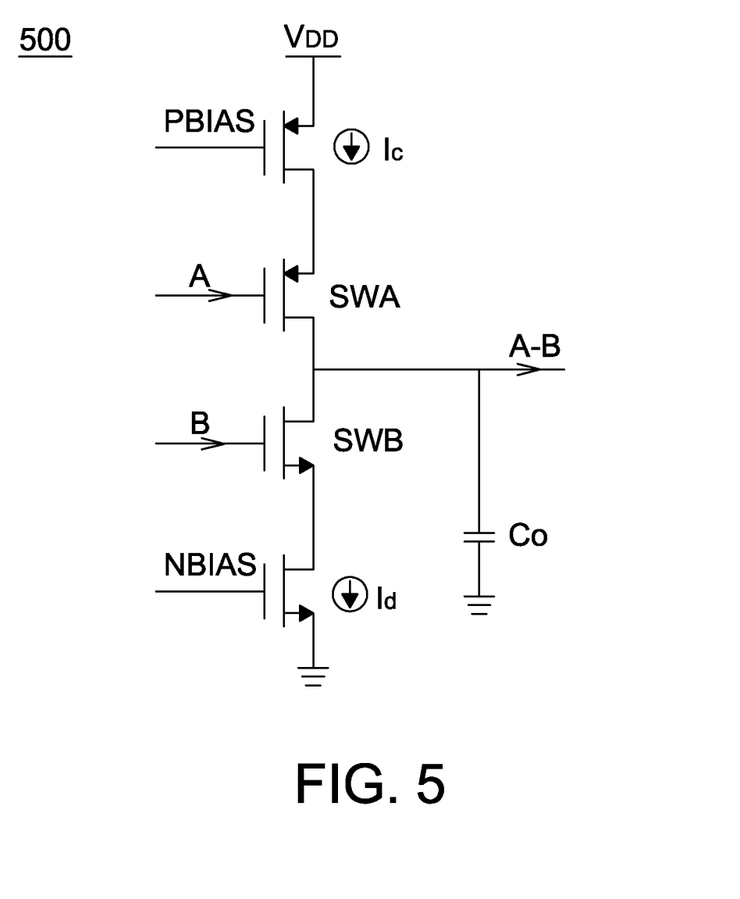
FIG. 5 is a circuit diagram of a subtraction circuit of a pixel circuit according to one embodiment of the present disclosure.
Figure 6:
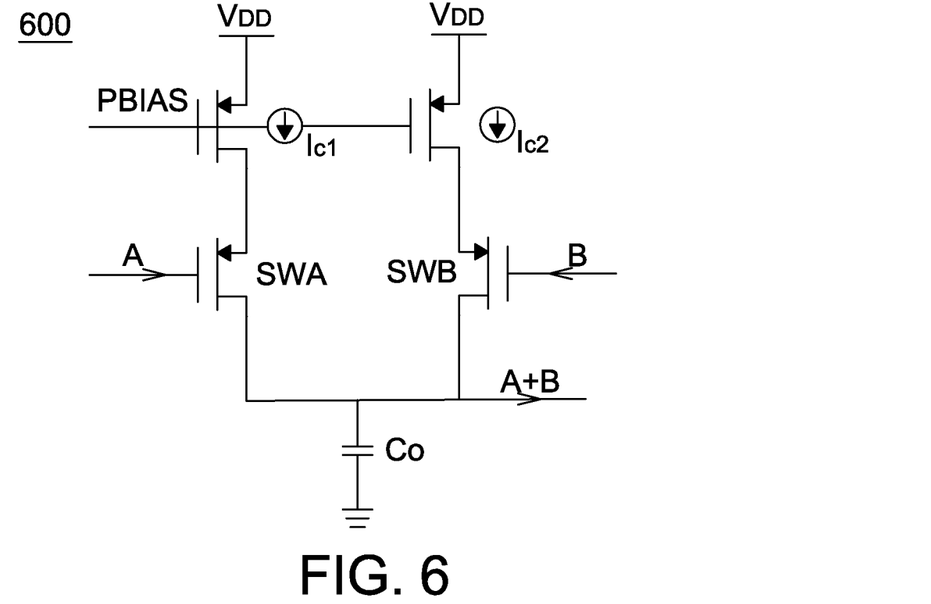
FIG. 6 is a circuit diagram of an addition circuit of a pixel circuit according to one embodiment of the present disclosure.
Figure 7:
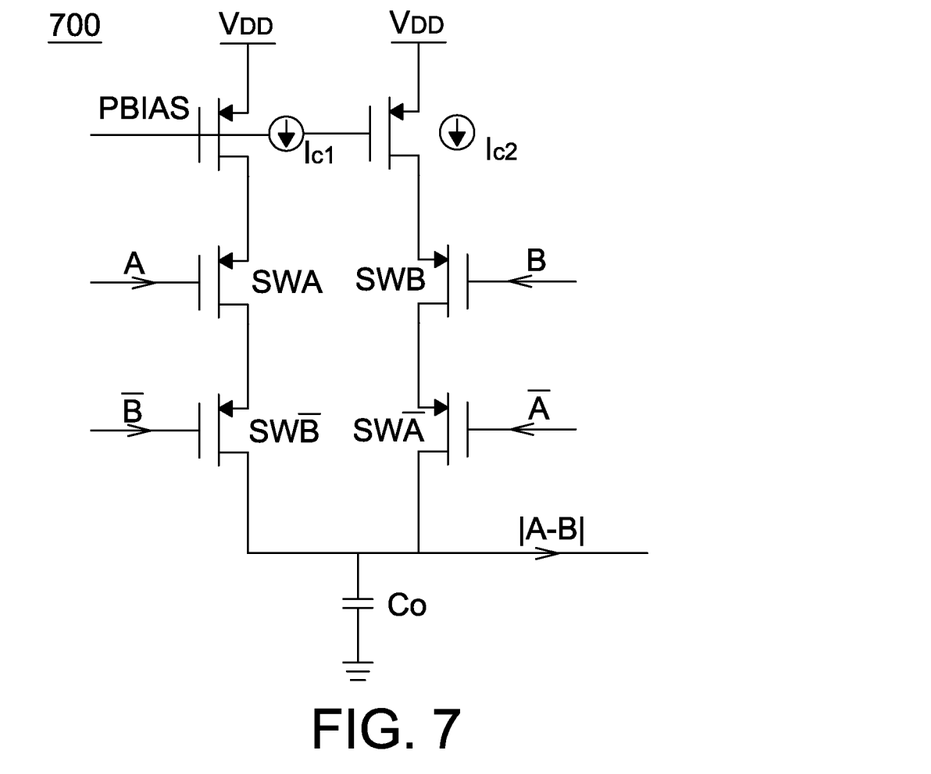
FIG. 7 is a circuit diagram of an absolute difference circuit of a pixel circuit according to one embodiment of the present disclosure.

The operation circuit 12 includes any circuit used to perform the operation between signals, e.g., described by a subtraction circuit in FIG. 5, an addition circuit in FIG. 6 and an absolute difference circuit in FIG. 7 herein, but not limited thereto. In a pixel array including multiple pixels, the operation circuit 12 is arranged inside each pixel to process data in the pixel or arranged between pixels to process data between pixels.

In some aspects, the pixel structure further includes an identify circuit 14. The identify circuit 14 includes, for example, a comparator for comparing the output result of the operation circuit 21 with a predetermined threshold so as to identify an operating state of a device adopting the pixel structure of the present disclosure. For example, when the pixel structure of the present disclosure is adapted to a mouse device, the identify circuit 14 is used to identify whether the mouse device is lifted up by a user. The output result of the operation circuit 12 indicates a brightness variation. When the identify circuit 14 identifies that the brightness variation is larger than or smaller than a brightness threshold, the mouse device is identified to be lifted by the user. The identify circuit 14 then outputs a control signal to perform corresponding controls, e.g., turning off the light source and/or not outputting displacement signals, but not limited to.

Figure 2:
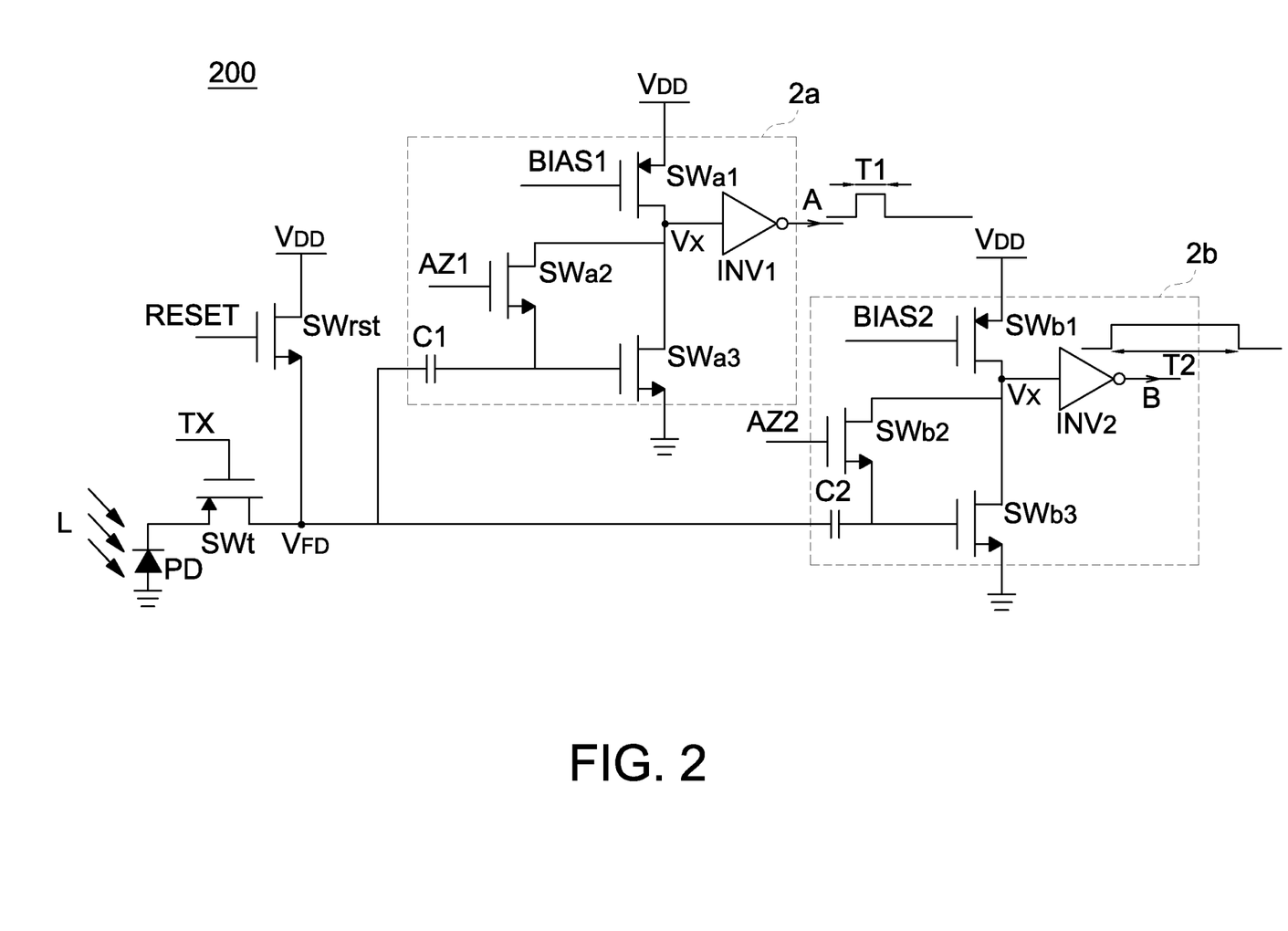
FIG. 2 is a circuit diagram of a pixel circuit according to one embodiment of the present disclosure.

Please referring to FIG. 2, it is a circuit diagram of a pixel circuit 200 according to one embodiment of the present disclosure. The pixel circuit 200 is used to output pulse width (PW) signals A and B, i.e. detection signals. The pixel circuit 200 includes a photodiode PD, a transfer transistor SWt, a reset transistor SWrst, a first temporal circuit 2a and a second temporal circuit 2b all connected to a node $V_{FD}$.

The photodiode PD is used to generate light energy according to the light L being received. The light energy is respectively stored in the first temporal circuit 2a and the second temporal circuit 2b within different time intervals (e.g., controlled by a control signal TX). In the present disclosure, in addition to storing light energy detected within different time intervals, the first temporal circuit 2a and the second temporal circuit 2b further respectively convert the stored light energy into detection signals A and B having corresponding pulse widths (e.g., T1 and T2) for the operation circuit 12 to perform analog operation. The first temporal circuit 2a and the second temporal circuit 2b have identical circuit arrangement only being operated within different time intervals.

Figure 4A:
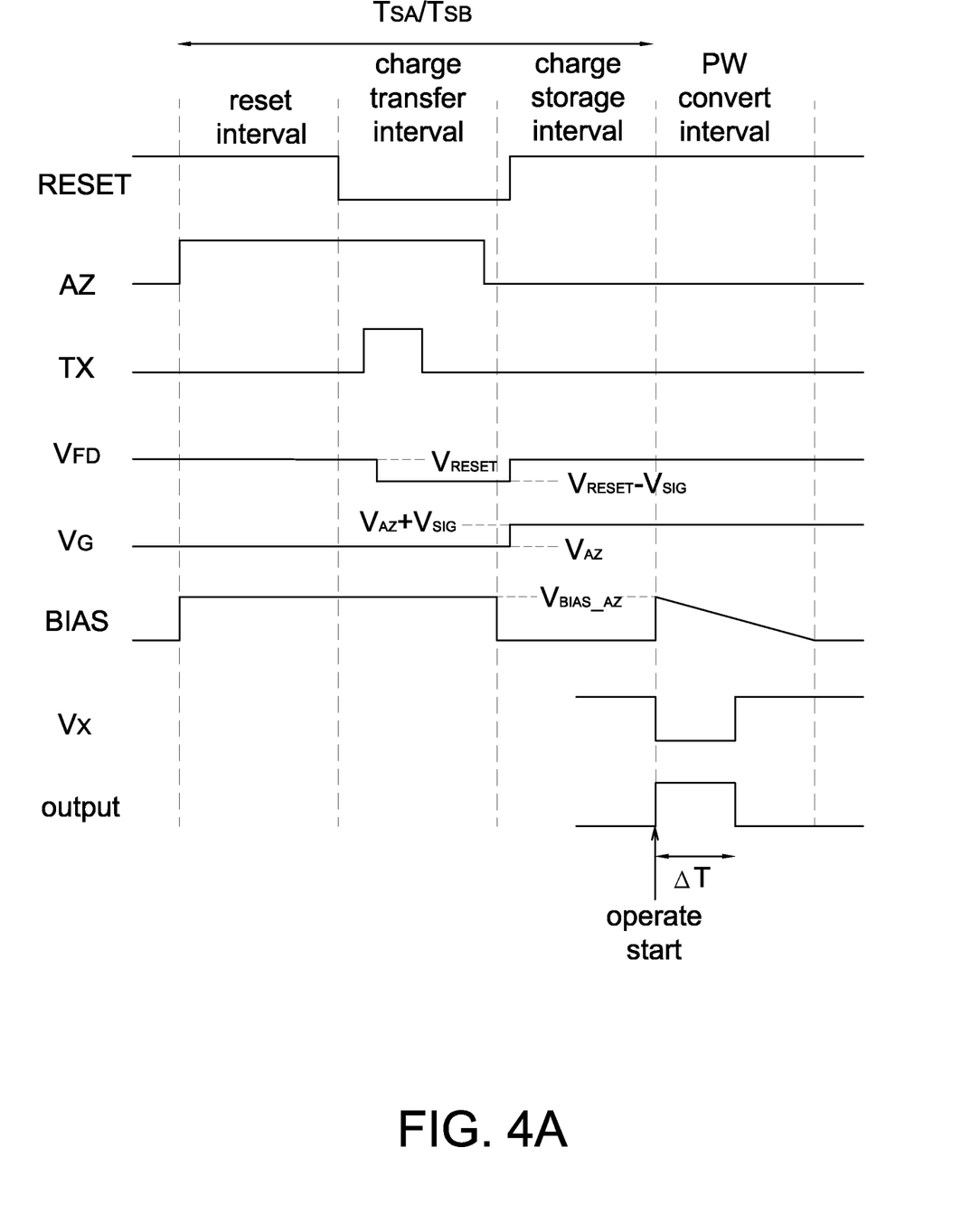
FIG. 4A is an operational timing diagram of the temporal circuit in FIG. 3.
Figure 4B:
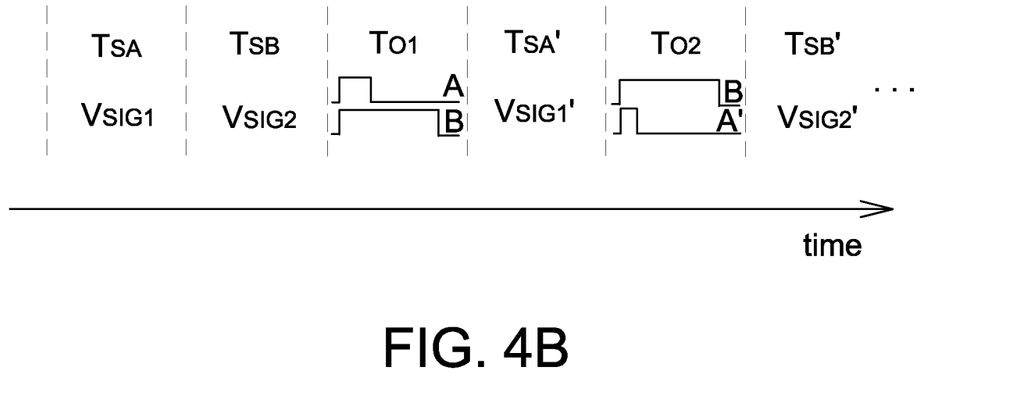
FIG. 4B is an operational timing diagram of the pixel circuit in FIG. 2.

The first temporal circuit 2a stores first light energy (e.g., referring to $V_{SIG1}$ shown in FIG. 4B), generated by the photodiode PD within a first interval (e.g., referring to $T_{SA}$ shown in FIG. 4B), and outputs a first detection signal A having a first pulse width T1 according to the first light energy $V_{SIG1}$ within an operation interval (e.g., referring to $T_{O1}$ shown in FIG. 4B).

The second temporal circuit 2b stores second light energy (e.g., referring to $V_{SIG2}$ shown in FIG. 4B) generated by the photodiode PD within a second interval (e.g., referring to $T_{SB}$ shown in FIG. 4B), and outputs a second detection signal B having a second pulse width T2 according to the second light energy $V_{SIG2}$ within the operation interval $T_{O1}$. It is appreciated that lengths of T1 and T2 in drawings are only intended to illustrate but not to limit the present disclosure.

The reset transistor SWrst is coupled between a voltage source $V_{DD}$ and the node $V_{FD}$, and used to reset the first temporal circuit 2a in the first interval $T_{SA}$ and reset the second temporal circuit 2b in the second interval $T_{SB}$.

The transfer transistor SWt is coupled between the photodiode PD and the node $V_{FD}$, and used to transfer the first light energy $V_{SIG1}$ to be stored into the first temporal circuit 2a in the first interval $T_{SA}$ and transfer the second light energy $V_{SIG2}$ to be stored into the second temporal circuit 2b in the second interval $T_{SB}$. In this way, the pixel circuit 200 stores detected light energy of different time intervals to indicate the variation of detected light with time.

In some aspects, the first temporal circuit 2a further includes a first inverter INV1 coupled between an output terminal of the first temporal circuit 2a and the operation circuit 12, and the first inverter INV1 is used to invert a phase of the first detection signal A; the second temporal circuit 2b further includes a second inverter INV2 coupled between an output terminal of the second temporal circuit 2b and the operation circuit 12, and the second inverter INV2 is used to invert a phase of the second detection signal B. In other aspects, the first inverter INV1 and the second inverter INV2 are arranged in the operation circuit 12 instead of being arranged in the first temporal circuit 2a and the second temporal circuit 2b.

Figure 3:
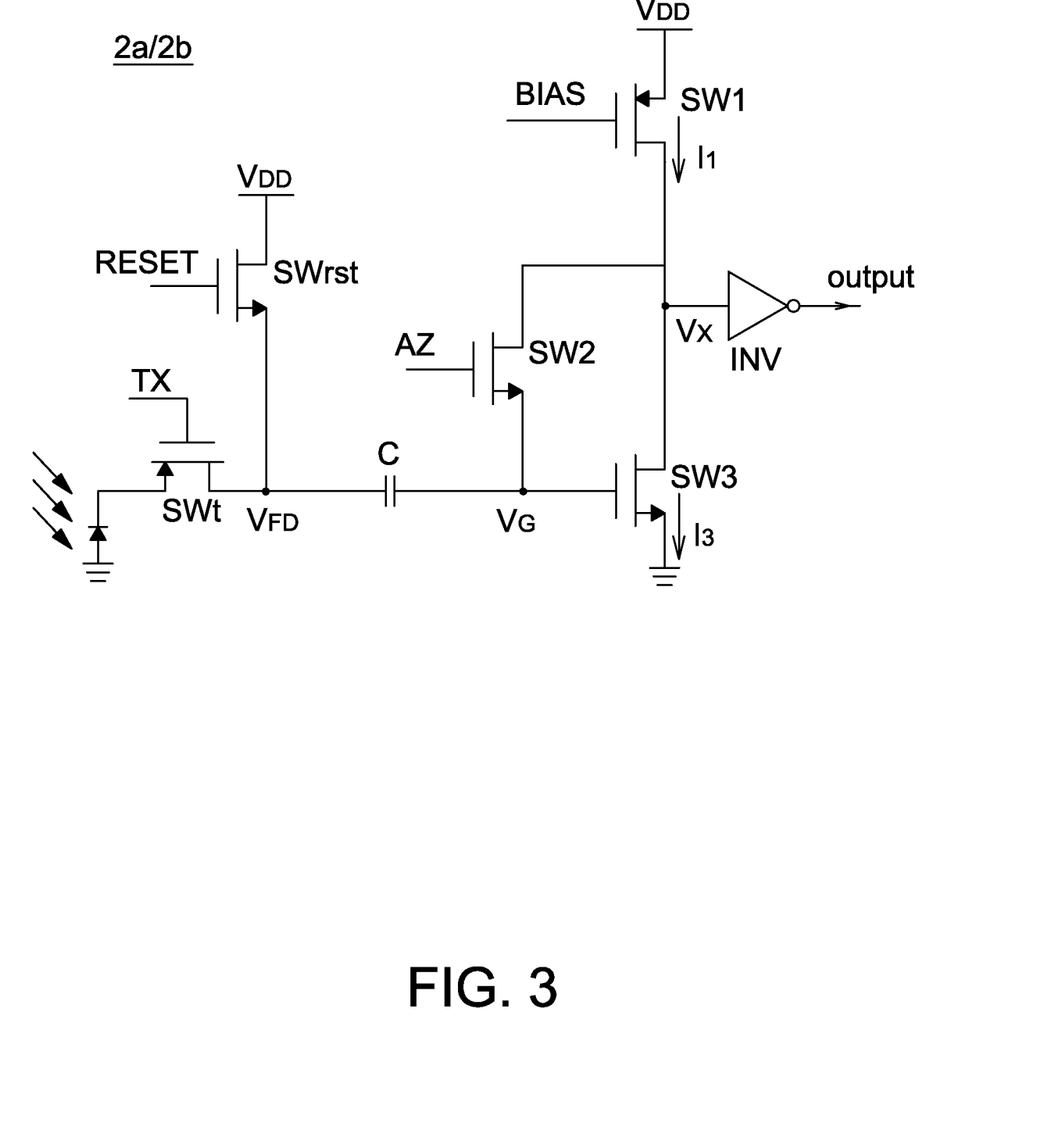
FIG. 3 is a circuit diagram of a temporal circuit of a pixel circuit according to one embodiment of the present disclosure.

Please referring to FIGS. 3 and 4A, FIG. 3 is a circuit diagram of the temporal circuit (e.g., 2a and 2b) of a pixel circuit according to one embodiment of the present disclosure; and FIG. 4A is an operational timing diagram of the temporal circuit 2a/2b in FIG. 3. It should be mentioned that although FIG. 2 shows that a single pixel circuit includes two temporal circuits, but the present disclosure is not limited thereto. In other aspects, each pixel circuit includes a single temporal circuit as shown in FIG. 3 to output a PW signal A or B.

In the present disclosure, operation of the temporal circuits 2a and 2b in FIG. 2 is described using FIGS. 3 and 4A.

The temporal circuits 2a and 2b respectively include a storage capacitor C, a first transistor SW1, a second transistor SW2 and a third transistor SW3. The storage capacitors and the first to third transistors are indicated by different reference numerals in FIG. 2 to indicate belonging to different temporal circuits.

A first end of the storage capacitor C (shown as a first capacitor C1 in the first temporal circuit 2a and as a second capacitor C2 in the second temporal circuit 2b) is coupled to the reset transistor SWrst. The storage capacitor C is used to store light energy generated by the photodiode PD, e.g., the first light energy $V_{SIG1}$ or the second light energy $V_{SIG2}$.

The first transistor SW1 (shown as SWa1 in the first temporal circuit 2a and as SWb1 in the second temporal circuit 2b) is coupled between the voltage source $V_{DD}$ and a node Vx, and is controlled by a control signal BIAS (shown as BIAS1 in the first temporal circuit 2a and as BIAS2 in the second temporal circuit 2b) to convert the stored light energy to a detection signal, e.g., the first detection signal A or the second detection signal B.

The second transistor SW2 (shown as SWa2 in the first temporal circuit 2a and as SWb2 in the second temporal circuit 2b) is coupled between the storage capacitor C and the first transistor SW1, and controlled by a control signal AZ (shown as AZ1 in the first temporal circuit 2a and as AZ2 in the second temporal circuit 2b). In the first interval $T_{SA}$, the second transistor SWb2 is not conducted to avoid changing the stored energy in the second capacitor C2; and in the second interval $T_{SB}$, the first transistor SWa2 is not conducted to avoid changing the stored energy in the first capacitor C1.

The third transistor SW3 (shown as SWa3 in the first temporal circuit 2a and as SWb3 in the second temporal circuit 2b) is coupled between a second end of the storage capacitor C and a ground voltage.

Please referring to FIG. 4A again, it shows that operation of the temporal circuit 2a/2b includes a reset interval, a charge transfer interval, a charge storage interval and a pulse width (PW) convert interval. In the reset interval, control signals BIAS, RESET and AZ are respectively at a high voltage level to reset charges on the storage capacitor C, e.g., a voltage of the node $V_{FD}$ being reset to $V_{RESET}$ (e.g., equal to $V_{DD}$) and a voltage of the node $V_G$ being reset to $V_{AZ}$. In the charge transfer interval, the control signal RESET is changed to a low voltage level, and when the control signal TX is changed to a high voltage level, the light energy $V_{SIG}$ detected by the photodiode PD is transferred to the node $V_{FD}$ via the transfer transistor SWt to cause the voltage thereon to decrease to $V_{RESET}-V_{SIG}$, wherein $V_{SIG}$ indicates the detected light energy. In the charge storage interval, the control signal RESET is changed to the high voltage level again and the control signals BIAS and AZ are changed to low voltage levels to store the light energy $V_{SIG}$ to the node $V_G$ to cause the voltage thereon to increase to $V_{AZ}+V_{SIG}$. Meanwhile, if the control signal AZ is kept at the low voltage level to turn off the second transistor SW2, charges stored in the storage capacitor C are substantially kept constant.

In FIG. 4A, the reset interval, the charge transfer interval and the charge storage interval as a whole is used as an energy storage interval $T_{SA}$ of the first temporal circuit 2a or an energy storage interval $T_{SB}$ of the second temporal circuit 2b. Before the operation circuit 12 starts to operate, the first temporal circuit 2a and the second temporal circuit 2b sequentially store light energy detected by the photodiode PD. As shown in FIG. 4A, till the PW convert interval is entered after the operation starts, the first light energy $V_{SIG1}$ in the first temporal circuit 2a is converted to the first detection signal A and the second light energy $V_{SIG2}$ in the second temporal circuit 2b is converted to the second detection signal B.

In the PW convert interval, the control signal BIAS uses a ramp signal having the voltage level decreasing with time. When the control signal BIAS starts at a high voltage level (e.g., $V_{BIAS\_AZ}$), the current I1 flowing through the first transistor SW1 is smaller than the current I3 flowing through the third transistor SW3 to cause an output voltage of Vx to have a low voltage level. With the level decreasing of the control signal BIAS, the current I1 is increasing correspondingly, and when the current I1 is substantially identical to the current I3, the output voltage of Vx changes to a high voltage level to form a negative PW signal. After the output voltage of Vx passes an inverter INV, a positive PW signal is generated as shown in FIG. 4A, wherein a pulse width ΔT is positively related to the light energy $V_{SIG}$. In this way, the temporal circuits 2a and 2b of the present disclosure convert light energy detected by the photodiode PD to a timing signal to be operated by the operation circuit 12.

Please referring to FIG. 4B, it is an operational timing diagram of the pixel circuit 200 in FIG. 2. The first temporal circuit 2a stores first light energy $V_{SIG1}$ in the first capacitor C1 in the first interval (e.g., the energy storage interval $T_{SA}$) using the operation of FIG. 4A. The second temporal circuit 2b stores second light energy $V_{SIG2}$ in the second capacitor C2 in the second interval (e.g., the energy storage interval $T_{SB}$) using the operation of FIG. 4A. Next, in the first operation interval $T_{O1}$, the first temporal circuit 2a uses a ramp signal having the voltage level decreasing with time as the control signal BIAS1 to convert the first light energy $V_{SIG1}$ into a first detection signal A; meanwhile, the second temporal circuit 2b uses a ramp signal having the voltage level decreasing with time as the control signal BIAS2 to convert the second light energy $V_{SIG2}$ into a second detection signal B. Preferably, the ramp signals BIAS1 and BIAS2 are substantially in-phase to generate detection signals A and B substantially at the same time, but not limited thereto. It is possible that detection signals A and B are generated sequentially depending on the operation of the operation circuit 12. The operation circuit 12 performs the numerical calculation on the first detection signal A and the second detection signal B in the first operation interval $T_{O1}$, e.g., the summation, subtraction and absolute differencing given in the present disclosure, but the present disclosure is not limited to these operations.

As shown in FIG. 4B, in the first operation interval $T_{O1}$, the first interval $T_{SA}$ for storing the first light energy $V_{SIG1}$ is prior to the second interval $T_{SB}$ for storing the second light energy $V_{SIG2}$.

In one aspect, after the first operation interval $T_{O1}$ is over, the second temporal circuit 2b continuously holds the second light energy $V_{SIG2}$, but the first temporal circuit 2a stores a next first light energy $V_{SIG1}$' in the first capacitor C1 in a next energy storage interval $T_{SA}$' also using the operation of FIG. 4A. Next, in a second operation interval $T_{O2}$, the first temporal circuit 2a uses a ramp signal having the voltage level decreasing with time as the control signal BIAS1 to convert the first light energy $V_{SIG1}$' into a first detection signal A'; meanwhile, the second temporal circuit 2b uses a ramp signal having the voltage level decreasing with time as the control signal BIAS2 to convert the second light energy $V_{SIG2}$ into a second detection signal B, which is substantially identical to that generated in the first operation interval $T_{O1}$.

The operation circuit 12 performs the numerical calculation on the first detection signal A' and the second detection signal B in the second operation interval $T_{O2}$. In the second operation interval $T_{O2}$, the first interval $T_{SA}$' for storing the first light energy $V_{SIG1}$' is behind the second interval $T_{SB}$ for storing the second light energy $V_{SIG2}$.

In the next energy storage interval, the first light energy $V_{SIG1}$' in the first temporal circuit 2a is maintained, but the second light energy in the second temporal circuit 2b is updated to $V_{SIG2}$'. By alternatively updating the light energy stored in the first temporal circuit 2a and the second temporal circuit 2b as shown in FIG. 4B, it is possible to perform the numerical calculation on signals of different time intervals.

Please referring to FIG. 5, it is a circuit diagram of a subtraction circuit 500 according to one embodiment of the present disclosure, which has two inputs respectively coupled to the first temporal circuit 2a and the second temporal circuit 2b to respectively receive a first detection signal A having a first pulse width T1 and a second detection signal B having a second pulse width T2. The subtraction circuit 500 includes an operation capacitor Co and cascaded first operation transistor SWA and second operation transistor SWB, wherein the operation capacitor Co is connected between the first operation transistor SWA and the second operation transistor SWB. The first operation transistor SWA is used as a switch to control a charging interval of a first current Ic to charge the operation capacitor Co according to the first pulse width T1; and the second operation transistor SWB is used as a switch to control a discharging interval of a second current Id to discharge the operation capacitor Co according to the second pulse width T2, wherein the first current Ic is substantially identical to the second current Id. In this way, the subtraction circuit 500 performs the numerical calculation of A-B. It is appreciated that when the subtraction circuit 500 performs the numerical calculation of B-A, gates of the first operation transistor SWA and the second operation transistor SWB receive opposite input signals, e.g., implemented by using a switching device or a multiplexer.

Please referring to FIG. 6, it is a circuit diagram of an addition circuit 600 according to one embodiment of the present disclosure, which has two inputs respectively coupled to the first temporal circuit 2a and the second temporal circuit 2b to respectively receive a first detection signal A having a first pulse width T1 and a second detection signal B having a second pulse width T2. The addition circuit 600 includes an operation capacitor Co and a first operation transistor SWA and a second operation transistor SWB connected in parallel, wherein the operation capacitor Co is connected between the first operation transistor SWA and the second operation transistor SWB. The first operation transistor SWA is used as a switch to control a first charging interval of a first current Ic1 to charge the operation capacitor Co according to the first pulse width T1; and the second operation transistor SWB is used as a switch to control a second charging interval of a second current Ic2 to charge the operation capacitor Co according to the second pulse width T2, wherein the first current Ic1 is substantially identical to the second current Ic2. In this way, the addition circuit 600 performs the numerical calculation of A+B.

Referring to FIG. 7, it is a circuit diagram of an absolute difference circuit 700 according to one embodiment of the present disclosure, which has two input sets respectively coupled to the first temporal circuit 2a and the second temporal circuit 2b to respectively receive first detection signals A and Abar having a first pulse width T1 and second detection signals B and Bbar having a second pulse width T2, wherein Abar and Bbar are generated from A and B using the inverter or vice versa. When the first pulse width T1 is larger than the second pulse width T2, the first input set (including operation transistors SWA and SWBbar) receives the pulse width signals A and Bbar to control a first charging interval of a first current Ic1 to charge the operation capacitor Co. When first pulse width T1 is smaller than the second pulse width T2, the second input set (including operation transistors SWB and SWAbar) receives the pulse width signals B and Abar to control a second charging interval of a second current Ic2 to charge the operation capacitor Co. In this way, the absolute difference circuit 700 performs the numerical calculation of |A−B|.

Although the current sources in FIGS. 5-7 are shown to be implemented by controlling a transistor using a control signal PBIAS, but the present disclosure is not limited thereto. Other current sources may be used.

Figure 8:
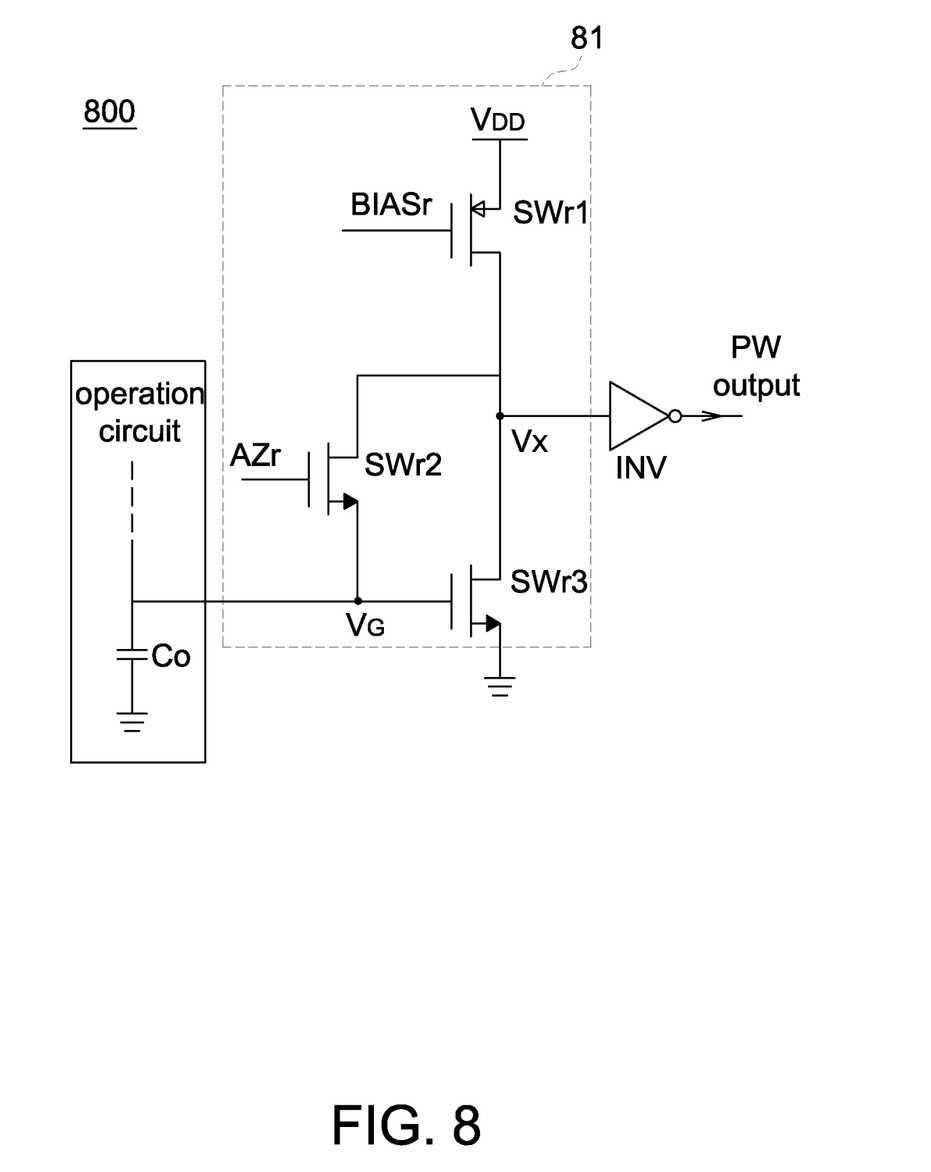
FIG. 8 is a circuit diagram of a recursive circuit of a pixel circuit according to one embodiment of the present disclosure.

Please referring to FIG. 8, it is a circuit diagram of a recursive circuit 800 of a pixel circuit according to one embodiment of the present disclosure. The recursive circuit 800 is coupled to the operation circuit 12 and used to control the operation timing of the operation circuit 12 and convert the operation result (i.e. charges stored in the operation capacitor Co) into a pulse width signal again for the next operation, e.g., the PW output of the recursive circuit 800 being coupled to one signal input of the operation circuit 12 as the signal A or B in FIGS. 5 to 7.

The recursive circuit 800 includes a first recursive transistor SWr1, a second recursive transistor SWr2 and a third recursive transistor SWr3, which have identical connection as the first transistor SW1, the second transistor SW2 and the third transistor SW3 in FIG. 3.

In FIG. 8, the circuit in a dashed block 81 is referred to a voltage-temporal conversion circuit which is used to convert a voltage on the operation capacitor Co to a PW signal similar to A and B, wherein the operation capacitor Co in FIG. 8 is the operation capacitor Co in FIGS. 5 to 7.

Figure 9:
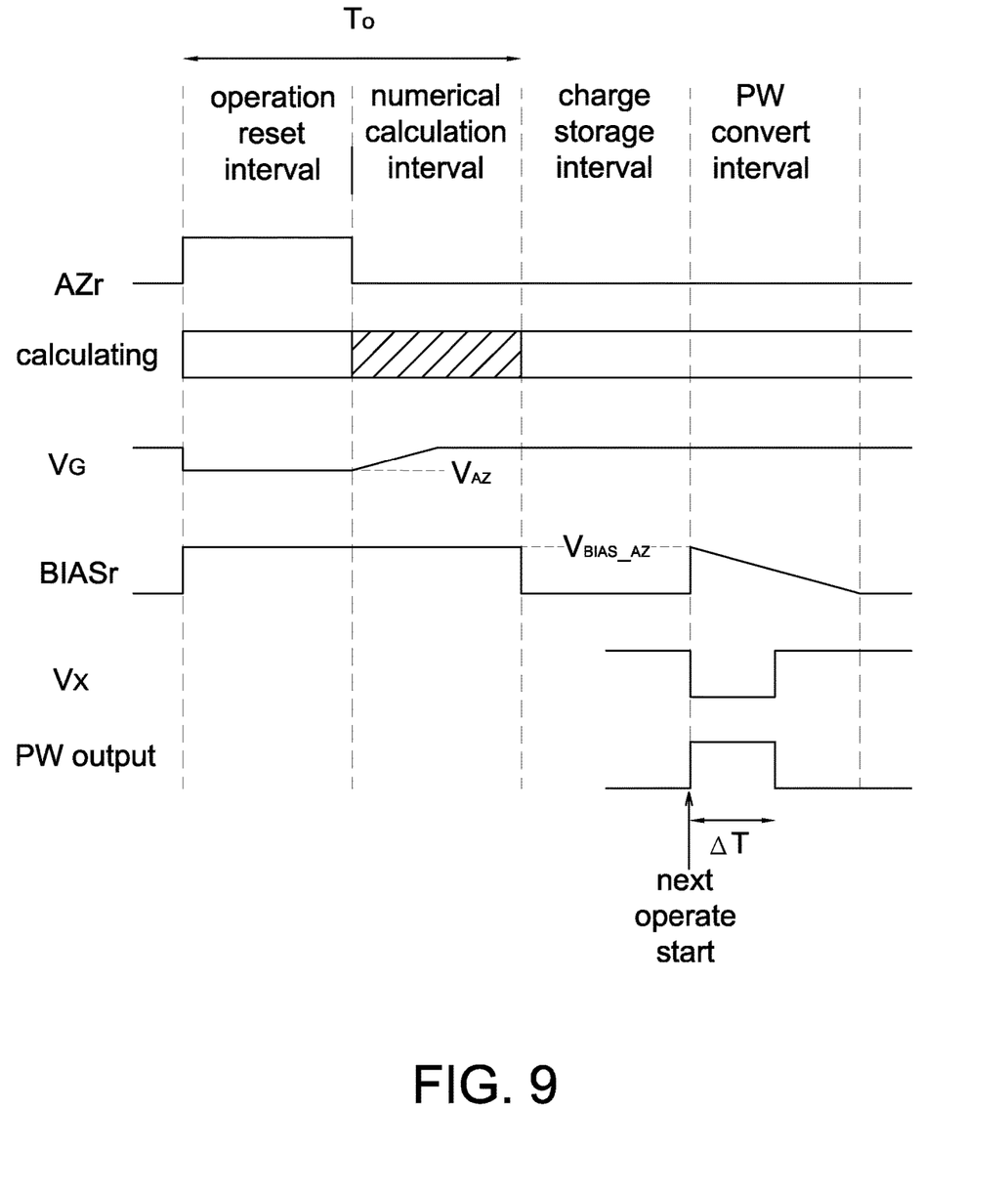
FIG. 9 is an operational timing diagram of the recursive circuit in FIG. 8.

Please referring to FIG. 9 together, it is an operational timing diagram of the recursive circuit 800 in FIG. 8. Before the operation capacitor Co starts to perform the numerical calculation on the detection signal A from the first temporal circuit 2a and the second detection signal B from the second temporal circuit 2b, the operation capacitor Co is reset at first. In the operation reset interval, control signals AZr and BIASr are respectively changed to a high voltage level for resetting a voltage of the operation capacitor Co to $V_{AZ}$. In this aspect, the second recursive transistor SWr2 is used as an operation reset transistor so as to reset the voltage of the operation capacitor Co in the operation reset interval. In the numerical calculation interval (e.g., slant-lines region), the control signal AZr is changed to a low voltage level and the operation result of the operation circuit 12 is stored in the operation capacitor Co to change a voltage thereon, wherein magnitude of the voltage change is corresponding to the operation result. Next, in the charge storage interval, the operation capacitor Co holds the voltage thereon. Till a next operation starts, the voltage-temporal conversion circuit 81 converts the calculated voltage to a PW signal for the operation of the operation circuit 12. The operations of the charge storage interval and the PW convert interval of the recursive circuit 800 are similar to those of the charge storage interval and the PW convert interval in FIG. 4A, e.g., using a ramp signal to generate the PW signal, and thus details thereof are not repeated herein.

In one aspect, the recursive circuit 800 further includes an inverter INV to invert a phase of the outputted PW signal.

However, when the operation circuit 12 includes an inverter therein, the recursive circuit 800 does not include the inverter INV.

In the present disclosure, the PW convert interval of FIG. 4A as well as the operation reset interval and the numerical calculation interval of FIG. 9 as a whole is referred to an operation interval $T_O$ herein, wherein the operation reset interval of FIG. 9 is performed in parallel with or behind the PW convert interval of FIG. 4A.

It is appreciated that if there is no next operation after the recursive circuit 800, the recursive circuit 800 directly provides (e.g., controlled by a switching device) the calculated voltage on the operation capacitor Co to the identify circuit 14 for identification, e.g., compared with a reference voltage using a comparator.

The circuit in FIG. 8 is called recursive circuit because the operation result of the operation circuit 12 may be stored and then converted to a PW signal multiple times by the recursive circuit 800 to perform multiple recursive operations. That is, the operation circuit 12 not only calculates the detected result of the photodiode PD, but also calculates the operation result thereof with the operation result of other pixels.

In this way, by using the pixel circuit 200 of FIG. 2 in conjunction with the recursive circuit 800 of FIG. 8, it is possible to perform various pixel-wise operations on the pixel data for various applications. The identify circuit 14 performs various identifications according to a final operation result of the pixel circuit 20 and the recursive circuit 800, e.g., identifying the lift-up of a navigation device, calculating the navigation vector, performing image recognition, categorizing images, performing motion detection and performing multi-layer neural network so as to realize the pixel structure with pixel-wise operation.

Figure 10:
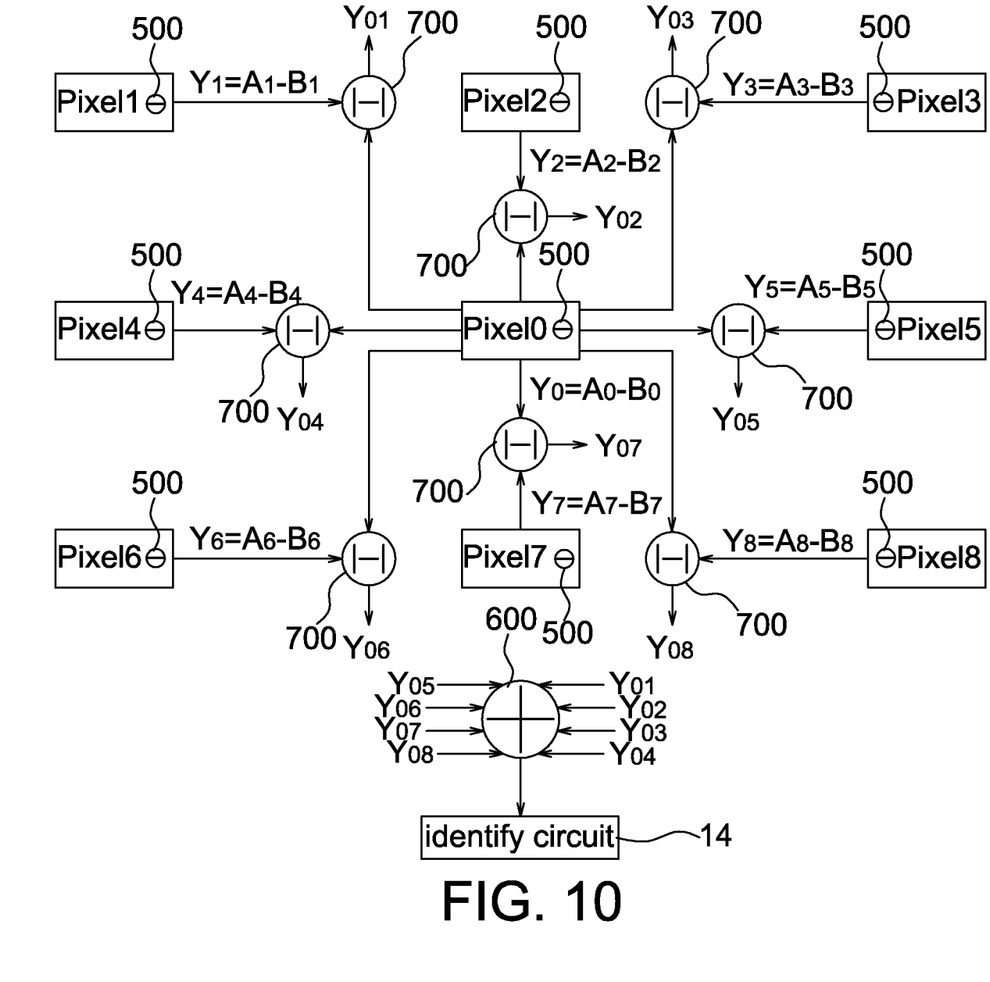
FIG. 10 is a schematic diagram of one application of a pixel circuit according to one embodiment of the present disclosure.

For example referring to FIG. 10, it is a schematic diagram of one application of the pixel circuit of the present disclosure that performs the motion detection (e.g., adapted to a security system). A pixel array of a camera includes multiple pixels arranged in an array. The identify circuit 14 performs the motion detection according to 9 adjacent pixels, including pixel 0 to pixel 8, wherein the pixel 0 is a central pixel of pixel 1 to pixel 8. In this aspect, the pixels 0 to 8 respectively include the pixel circuit 200 in FIG. 2 and/or at least one operation circuit 12.

As mentioned above, pixels 0 to 8 respectively generate a first detection signals A0 to A8 and second detection signals B0 to B8. After the subtraction circuit 500 (e.g., included in the pixel circuit of pixels 0 to 8, but not limited to) performs the numerical calculation on the first detection signals A0 to A8 and the second detection signal B0 to B8 of the pixels 0 to 8, the subtracted result Y0 to Y8 are obtained and stored in the corresponding operation capacitor Co (e.g., shown in FIG. 8), wherein Y0 to Y8 indicate that each of pixels 0 to 8 performs the temporal difference operation on detected signals obtained in different detection intervals to represent the brightness variation detected by every pixel.

Next, after converting Y0 to Y8 to PW signals using the recursive circuit 800, the absolute difference circuit 700 performs the numerical calculation of absolute differencing between Y0 and Y1, Y0 and Y2 ... Y0 and Y8 to obtain Y01 to Y08, wherein Y01 to Y08 indicate that the pixel array performs the spatial difference operation between different pixels, and Y01 to Y08 contain the operation result of both the temporal difference and spatial difference.

Finally, Y01 to Y08 are summed by the addition circuit 600. Similarly, Y01 to Y08 are firstly stored in the corresponding operation capacitor Co, and then converted to PW signals by the voltage-temporal conversion circuit 81 for the summation of the addition circuit 600.

In one aspect, the addition circuit 600 includes two inputs as shown in FIG. 6, and the addition circuit each time performs the summation of two of Y01 to Y08 that is stored and voltage-temporal converted, and then summed with another one of the rest of Y01 to Y08 till all of Y01 to Y08 is added together.

In another aspect, the addition circuit includes 8 inputs and uses the pulse widths associated with Y01 to Y08 to control the charging intervals of respective current sources as a way of adding Y01 to Y08 together.

The identify circuit 14 receives a summation of the addition circuit 600, and compares the summation with a predetermined threshold (e.g., using a comparator). When the summation of Y01 to Y08 is larger than or equal to the predetermined threshold, it means that a motion is detected. The identify circuit 14 then outputs a control signal to perform corresponding controls, e.g., turning on a light source, starting to record images or increasing image capture frequency.

In another aspect, the identify circuit 14 receives a summation of the temporal differences Y0 to Y8 (e.g., Y0 to Y8 directly outputted to the addition circuit 600 from pixels 0 to 8). When the summation is larger than or smaller than (determined according to the light source arrangement) a brightness threshold, it means that a mouse device is lifted up by a user.

It is appreciated that although FIG. 10 uses 9 neighboring pixels to detect the temporal and spatial brightness variation to perform the motion detection or lift-up detection, the present disclosure is not limited thereto. The identify circuit 14 uses a proper number of pixels to detect the temporal and spatial brightness variation, e.g., the proper number being determined according to environment to be detected and a size of pixel array.

As mentioned above, in the conventional optical sensor, pixel data is converted to digital data at first, and then the digital data is operated by the digital backend such that frame buffers are required to temporarily store frame data. Accordingly, the present disclosure further provides a pixel circuit that outputs pulse width signals for the analog operation (e.g., FIG. 2 and FIGS. 5 to 7). The pixel circuit outputs, within an operation interval, the PW signals corresponding to different detecting intervals for the analog operation of an operation circuit so as to realize the objective of the pixel-wise operation of pixel data.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A pixel circuit, comprising:
   a photodiode, configured to generate light energy; and
   a temporal circuit, configured to convert the light energy generated by the photodiode to a detection signal having a pulse width corresponding to the light energy, the temporal circuit comprising:
      a storage capacitor, having a first end coupled to the photodiode, and configured to store the light energy;
      a first transistor, configured to be controlled by a control signal to convert the light energy to the detection signal;

a second transistor, coupled between a second end of the storage capacitor and the first transistor; and a third transistor, coupled between the second end of the storage capacitor and a ground voltage.

2. The pixel circuit as claimed in claim 1, further comprising a reset transistor coupled between the photodiode and the temporal circuit, and configured to reset the temporal circuit.

3. The pixel circuit as claimed in claim 1, wherein the control signal is a ramp signal for converting the light energy to the detection signal, and when the light energy is larger, the pulse width of the detection signal is longer.

4. The pixel circuit as claimed in claim 1, further comprising a transfer transistor connected between the photodiode and the temporal circuit.

5. The pixel circuit as claimed in claim 1, further comprising an inverter configured to invert a phase of the detection signal.

6. A pixel circuit, comprising:

a photodiode; and a temporal circuit, coupled to the photodiode and comprising:

a capacitor, having a first end coupled to the photodiode;

a first transistor, coupled between a voltage source and a node, wherein a controlled terminal of the first transistor is configured to receive a ramp signal for converting energy stored in the capacitor to a detection signal;

a second transistor, coupled between a second end of the capacitor and the node; and a third transistor, coupled between the node and a ground voltage, and a controlled terminal thereof being coupled to the second end of the capacitor.

7. The pixel circuit as claimed in claim 6, further comprising a reset transistor coupled between the photodiode and the temporal circuit, and configured to reset the temporal circuit.

8. The pixel circuit as claimed in claim 6, wherein a pulse width of the detection signal is positively related to the energy.

9. The pixel circuit as claimed in claim 6, further comprising a transfer transistor connected between the photodiode and the temporal circuit.

10. The pixel circuit as claimed in claim 6, further comprising an inverter connected behind the node.

11. An optical sensor, comprising:

a photodiode, configured to generate light energy; and a first temporal circuit and a second temporal circuit, both coupled to the photodiode and respectively configured to store the light energy within different time intervals, each of the first temporal circuit and the second temporal circuit comprising:

a capacitor, having a first end coupled to the photodiode;

a first transistor, coupled between a voltage source and a node;

a second transistor, coupled between the node and a second end of the capacitor; and a third transistor, coupled between the node and a ground voltage, and a controlled terminal thereof being connected to the second end of the capacitor; and a reset transistor configured to reset the first temporal circuit and the second temporal circuit within the different time intervals.

12. The optical sensor as claimed in claim 11, wherein the first temporal circuit and the second temporal circuit are respectively configured to output a detection signal, converted from the light energy, within the same operation interval.

13. The optical sensor as claimed in claim 12, wherein controlled terminals of the first transistor of the first temporal circuit and the second temporal circuit are respectively configured to receive a ramp signal for converting the light energy to the detection signal.

14. The optical sensor as claimed in claim 11, further comprising a transfer transistor connected between the photodiode and the first and second temporal circuits.

15. The optical sensor as claimed in claim 11, wherein each of the first temporal circuit and the second temporal circuit further comprises an inverter connected behind the node.

16. The optical sensor as claimed in claim 11, wherein the second transistors of the first temporal circuit and the second temporal circuit are not conducted simultaneously within the different time intervals.

* * * * *